United States Patent [19]

Keyser et al.

[11] Patent Number: 4,988,550

[45] Date of Patent: Jan. 29, 1991

[54] CONDUCTIVE MASKING LAMINATE

[75] Inventors: Paul Keyser, Newbury, Mass.; Peter Jones, Londonderry, N.H.; John D. Hubbard, Billerica, Mass.

[73] Assignee: Chomerics, Inc., Woburn, Mass.

[21] Appl. No.: 386,393

[22] Filed: Jul. 28, 1989

[51] Int. Cl.⁵ .......................... B32B 7/06; B32B 7/12
[52] U.S. Cl. ....................................... 428/40; 428/42; 428/43; 428/77; 428/173; 428/194; 428/202; 428/354; 428/356; 118/505
[58] Field of Search ....................... 428/40, 43, 42, 77, 428/194, 202, 173, 354, 356, 906; 118/505

[56] References Cited

U.S. PATENT DOCUMENTS 3,497,383  2/1970  Olyphant, Jr. et al. ............ 117/212

OTHER PUBLICATIONS

"CHO-Mask EMI Foil Tape with Peel-Off Mask", published as part of the publication *EMI Shielding Engineering Handbook*, by Chomerics, Inc., copyright 1987.

*Primary Examiner*—Alexander S. Thomas
*Attorney, Agent, or Firm*—John D. Hubbard; William L. Baker

[57] ABSTRACT

A masking tape for EMI shielding applications comprising an adhesive layer, a metal foil layer adhered to the top of the adhesive layer, two or more adhesive strips running parallel to the edges of the tape and extending the length of the foil along the strips are preferably inset from the outer edges of the foil so as to form a stepped or notch-like configuration. A mask layer is attached to the top of the strips. The mask alone or the mask and strips are designed to be removed after use. The tape is applied to a substrate such as a computer cabinet, the cabinet is then sprayed with a paint or finish coat and the mask is removed to reveal a conductive metal foil surface to which a conductive EMI shield can be mounted.

35 Claims, 2 Drawing Sheets

4,988,550

CONDUCTIVE MASKING LAMINATE

The present invention relates to a conductive maskable EMI tape for metal cabinets. More specifically, it relates to a masking tape for EMI shielding applications.

BACKGROUND OF THE INVENTION

Manufacturers of EMI shielded cabinetry, such as computer cabinets, need to provide a clean conductive surface on the support frames and enclosure panels onto which the EMI shielding may be attached. This has required a bare or plated surface be formed in these areas. A plated surface is preferred as it provides areas of high conductivity and corrosion resistance. The remainder of the cabinet is generally painted with an electrostatic discharge coating or a finish coat of paint. The plated areas need to be masked during the painting sequence. The mask is then stripped away, the EMI shielding is applied and the cabinet is assembled.

While this method has proven to be acceptable to the cabinet industry, the cost of plating such cabinets has increased dramatically due in part to the environmental considerations involved in such plating processes as well as the scarcity of platers and the cost of transporting the parts to and from the plater.

An alternative to the plating of the cabinet surfaces consists of a conductive metal foil having one side coated with a pressure sensitive conductive adhesive and the other side covered with a peelable plastic film such as a Mylar ® plastic film. The product is known as CHO-MASK ® and is available from Chomerics, Inc. The masking tape is applied to the desired areas of the cabinet which is then painted or provided with a finish coat. The cover film is then removed to reveal a conductive, noncorrosive surface to which the EMI shielding gasket is mated. The mask had one of two different peelable surfaces depending upon whether the finish coat on the cabinet was subjected to a bake cycle. If so, the peelable coat is designed to release upon being heated.

While generally acceptable, this mask system has several disadvantages. Customer confusion as to which type of peel system to be used often led to the use of the improper mask which resulted in the failure of the mask to either withstand the bake cycle or peel at room temperature. Additionally, the peel system used in the bake cycle applications has to be removed while still hot due to the adhesive system that is used. This type of mask is difficult if not impossible to remove when at room temperature and often results in rips or tears in the conductive foil which reduces the EMI shielding capability of the system in those locations. Further, an adhesive residue which remains on the foil surface after the cover layer must be removed. This residue can effect the shielding capabilities of the foil and thus required the additional step of cleaning the foil surface before applying the EMI shielding. Perhaps most importantly, as the cover layer is removed, it tends to chip or nick the paint along the edges of the foil, leaving exposed unplated or areas of the cabinet which can be subject to corrosion. Further, these nicks or chips allow air to get under the conductive foil which can subject the conductive adhesive layer to oxidation and subsequent failure.

SUMMARY OF THE INVENTION

The present invention overcomes the shortfalls of the prior masking materials, providing a conductive mask that is easy to install, does not cause corrosion of the metal cabinet or oxidation of the conductive adhesive layer and which provides at least one adhesive free area on the surface of the mask to which an EMI shield may be mated. The present conductive mask comprises a conductive metal foil layer, the bottom surface of the foil being coated with an adhesive layer, preferably conductive, the top surface of the foil having a plurality of adhesive strips, preferably two, formed along the outer periphery of the foil, and a releasable mask layer attached to the adhesive strips. The width of the outermost portions of the adhesive strips and the masking layer are equal to or less than the width of the foil layer. In one embodiment, the strips and mask are of width equal to that of the foil layer. The mask has a series of perforations formed inwardly from the outer edges of the foil layer to allow for the removal of the mask layer. In another embodiment, the strips and the mask are of a width less than that of the foil layer so as to form an idented, step-like or notched configuration.

DETAILED DESCRIPTION OF THE INVENTION

The present invention is a conductive laminate or tape which can be used as mask for use in EMI shielding applications.

Figure 1:
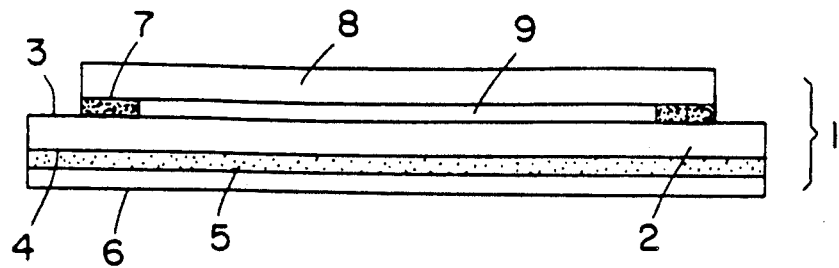
FIG. 1 shows a cross-sectional view taken across the width of a preferred embodiment of the present invention.

FIG. 1 shows a preferred embodiment of the present invention. The tape 1 has a conductive metal foil layer 2 having an upper surface 3 and lower surface 4. An adhesive layer 5, preferably electrically conductive, is coated on the lower surface 4 of the foil 2. Preferably, the adhesive layer is covered by a release layer 6. The upper surface 3 has a plurality of adhesive strips 7 which extend along the length of the foil layer 2, are spaced apart from each other and are parallel to the outer edges of the foil layer. A mask layer 8 is attached to the upper surface of the adhesive strips 7. The mask layer 8 covers one or more centrally located adhesive free areas 9 of the foil layer 2.

Figure 2:
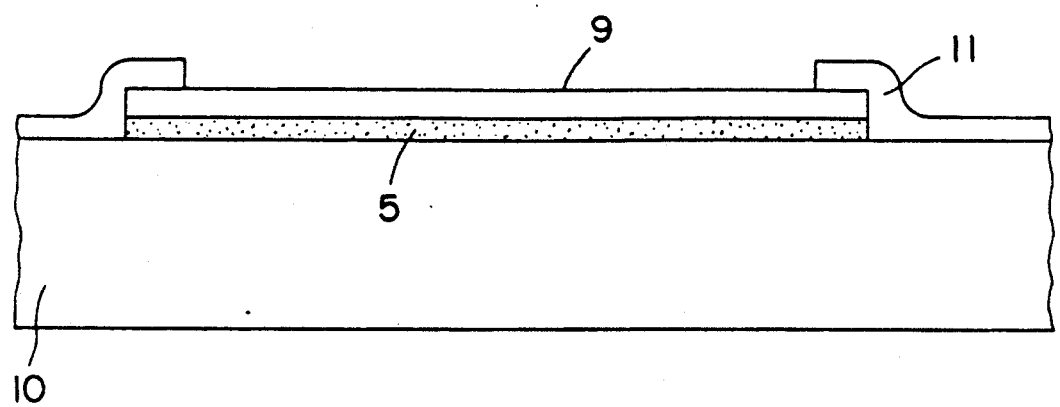
FIG. 2 shows the embodiment of FIG. 1 after having been installed to a substrate and subsequently treated.

The tape of FIG. 1 is applied to a substrate 10 such as a steel cabinet frame or door as shown in FIG. 2. The substrate with the tape is then subjected to one or more finish treatments such as the formation of a protective coating 11 on the substrate 10. At least a portion of the mask is then removed to expose the centrally located adhesive free area 9. An EMI shield such as a conductive gasket is mounted or mated to the adhesive free area 9 of the tape and the substrate is then joined to another substrate via the shield to establish electrical continuity between the substrates and form an EMI shielded cabinet, enclosure, etc.

Figure 3:
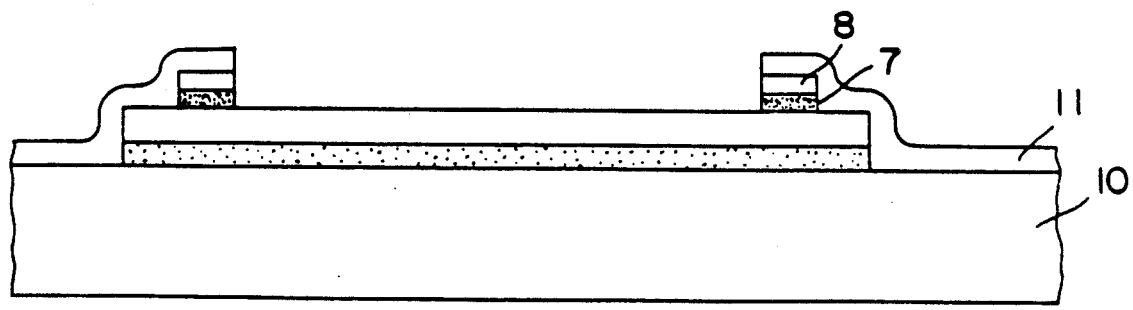
FIG. 3 shows a cross-sectional view taken across the width of another preferred embodiment of the present invention.

The mask layer may either be completely removable as shown is FIG. 2 or only a central portion of the mask layer may be removable as shown in FIG. 3.

The width of the mask layer may be equal to or less than the width of the foil layer. Preferably, the width of the mask layer is less than the width of the foil layer, especially when it is desired to remove the entire mask layer, as shown in FIG. 2. The width of the mask layer that is removable is always sufficiently narrow so that when removed, any chipping of the paint or finish coat that may occur does not extend to the edge of the foil layer or beyond. This prevents the corrosion of the substrate. Additionally, it also ensures that the paint forms an oxygen barrier along the edges of the foil and adhesive layer so that the foil and adhesive layer are not subjected to oxidation or corrosion.

In the embodiment of FIG. 2, where the entire mask and adhesive strip portions are removed, it is preferred that the adhesive strips have sufficient adhesive strength to retain the mask until its desired removal, but also they should have the ability to peel away cleanly and completely when removed.

When only a portion of the mask is removed, as shown in FIG. 3, it is preferred that at least the portion of the mask over the adhesive free area of the foil be removable. It is more preferred that the removable portion of the mask extend from at least the inner edge of the outermost adhesive strip on one side of the foil to at least the inner edge of the outermost adhesive strip on the other side of the foil.

One preferred means for forming such a removable mask portion is to use a series of perforations along the desired mask portions such that the mask is held in place until the perforations are ruptured, generally by a worker grabbing the portion of the mask over the adhesive free area of the foil and pulling on that portion of the tape. Another means for forming the removable portion of the mask is to cut the mask portion which lies on top of the adhesive strips such that the adhesive portion of the strip, inward of the cut, retains the mask in place until its desired removal. Other similar means for forming the removable portion may also be used.

Figure 5:
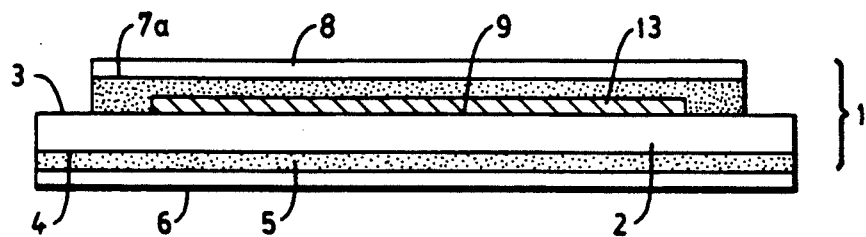

In an alternative embodiment, one large adhesive strip replaces the two or more smaller strips 7 of FIG. 1. In this embodiment, as shown in FIG. 5, the adhesive free area 9 of the foil 2 is first covered by a plastic film 13, such as a MYLAR ® film, having a width corresponding to that of the area 9. The adhesive strip 7a is then coated over that plastic film and a mask layer 8 is attached to its surface. The mask, adhesive and plastic film may be removed by any of the means discussed above.

The metal foil layer may be formed of any electrically conductive metal. It may also consist of a laminate of two or more metal foils. Preferably, the selected metal is non-corrosive, highly conductive, and has a high tensile strength in a thin sheet form. Such metals include but are not limited to gold, silver, aluminum, tin, zinc, nickel, copper, platinum, palladium, iron and its alloys, steel, stainless steel and various alloys of such metals. Additionally, the foil may be a plated, coated or clad metal foil, such as a noble metal coated non noble metal foil. The noble metal coating, plating or cladding on non noble metal foils is preferred as it is not subject to corrosion or oxidation and is highly conductive. Such foils include but are not limited to silver coated copper, aluminum, zinc, iron, iron alloys, steel including stainless steel, nickel or cobalt; gold coated copper, aluminum, tin, zinc, iron, iron alloys, steel including stainless steel, nickel or cobalt. Additionally, various non noble metal coated or plated foils may be used. Such foils include but are not limited to tin coated copper, tin coated aluminum and nickel coated copper.

The metal foil layer should be strong, ductile and relatively thin so as to be resistant to tearing and to be self supportive. Preferably the foil layer is from about 0005 to 0.020 inches thick, more preferably about 0.001 to 0.010 inches thick and most preferably about 0.002 to about 0.005 inches thick.

Figure 4:
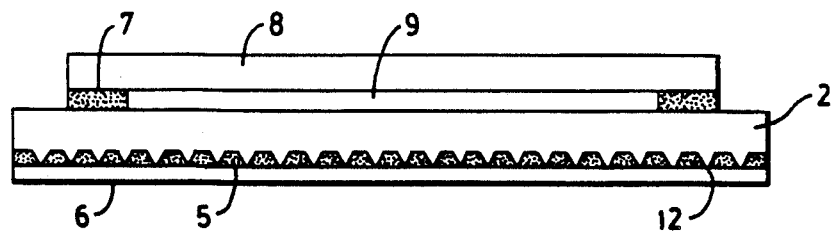
FIGS. 4 and 5 show other preferred embodiments of the present invention in a cross-sectional view.

In another embodiment, as shown in FIG. 4, the metal foil may contain a series of projections (12) formed in its surface which extend toward the bottom side 4 of the foil 2. The height of the projections should be substantially equal to or greater than the thickness of the adhesive layer on the bottom surface of the foil so that the projections themselves establish the conductive pathway between the foil and the substrate to which it is adhered. Preferably, the projections are embossed, calendared or needle punched after the foil has been coated with the adhesive layer. In this embodiment, it is not necessary that the adhesive layer be electrically conductive, however it is a preferred embodiment.

The adhesive layer coated on the bottom side of the foil layer is preferably electrically conductive although as discussed above, it need not be conductive if another means of establishing electrical conductivity between the foil and the substrate to which it is adhered is used. Preferably, the adhesive is pressure sensitive. By pressure sensitive, it is meant that the adhesive establishes a tight bond with the substrate to which it is applied under normal finger or hand pressure. Such adhesives generally do not require additional curing steps to form an adequate bond and therefore they are generally preferred in this application. Suitable pressure sensitive adhesives are well known and generally are formed from various rubbers, natural and synthetic, such as silicone, fluorosilicone and neoprene rubber, or synthetic polymers such as styrene butadiene copolymers and other such elastomeric copolymers, acrylics, acrylates, polyvinyl ethers, polyvinyl acetate copolymers, polyisobutylenes and mixtures thereof. An acrylic pressure sensitive adhesive is preferred. If a pressure sensitive adhesive is not used, then other well known adhesives may be used, including for example, epoxy or urethane adhesives. If the adhesive is electrically conductive, it generally contains one or more conductive fillers in an amount sufficient to provide the desired conductivity The fillers can be of any shape and size useful in such adhesives. Generally, the fillers are in the form of particles, flakes or fibers. The fillers may be of a size from submicron to about 400 microns across their largest diameter. Generally, fillers range in size from about 1 micron to 100 microns, more preferably about 20 to about 60 microns. The amount of filler should be sufficient to provide the desired electrical conductivity. Amounts generally range from about 1% by total weight of filler and adhesive to about 25% by total weight of filler and adhesive. Preferably, the amount of filler is from about 5% to 15% by total weight. The one or more electrically conductive fillers include but are not limited to solid metal fillers or solid carbon or graphite fillers. The fillers may also be plated particles such as noble metal plated metals, plastics or glass including but not limited to silver coated copper powder silver coated glass, and silver coated plastic. The means by which the adhesive is rendered conductive is not critical to the invention and any suitable means that provides the desired conductivity and adhesion may be used.

As described above, the adhesive layers preferably covered by a release layer 6 until used. Release layers are well known and commonly are formed of a coated paper or plastic sheet which has the ability to adhere to the adhesive layer so as to be removable under slight pressure without injuring the adhesive layer.

The strips of adhesive used on the upper side of the foil layer should provide adequate adhesion between the foil and mask layer so that the mask is not removed until desired. As discussed in reference to the embodiment of FIG. 3, the adhesive strips may be permanently adhered to the foil surface and the mask, with mask having a series perforations running along the length of the mask so that the portion of the mask above the adhesive free area of the tape can be removed when desired. Alternatively, the adhesive can be a release type of adhesive such that it is removed with the mask when the mask is peeled. This embodiment is shown in FIG. 2. The adhesive strips should be capable of withstanding the range of temperatures normally encountered in the painting/coating of such cabinets, including elevated temperatures at which a paint or coating may be baked to obtain a cured finish. It is not necessary that the adhesive strips be pressure sensitive, though they may be if so desired.

Such adhesives are well known and commercially available. Such adhesives include but are not limited to the adhesives described above in relation to the adhesive layer of the present invention.

The dimensions of each strip should be sufficient to allow for the proper retention and release of the mask and to allow for the formation of one or more adhesive free areas on the metal foil layer. As a guide, the total width of the strips should be about 25% or less of the width of the foil layer. With the width of tapes normally considered in this invention, the strips should be about 0.0005 to about 0.002 inches in thickness and about 0.0625 to about 0.25 inches in width. The strips are preferably continuous along the length of the metal foil, however, if desired, they may be formed intermittently along the length of the foil so long as it prevents the paint or finish coat from penetrating and covering the adhesive free area of the foil. Additionally, a plurality of strips may be used to form one or more adhesive free areas on the foil layer. Such an embodiment may be useful where two or more EMI shields are being used.

The mask material should be self supportive and essentially impervious so as to prevent the paint or finish coat from penetrating and covering the adhesive-free area of the metal foil. Preferred materials are plastic films, either thermoplastic or thermoset, such as polyamides, polyimides, polyethylenes and other olefinic polymers, polycarbonates, polyethylene terphathalates. Cellulosic films may also be used. Additionally, various coated papers, woven and non woven fabrics which are impervious to the finish coat may also be used. Likewise, if desired, one may also use a metal foil layer for the mask layer.

The tape system may vary in width depending upon that desired or required for the application. The tape should be sufficiently wide so that the EMI shield to which it is mated has an adequate adhesive free foil surface to contact. Generally, the tape may be from about 0.25 inches to about 12 inches in width. Preferably, the tape is from about 0.75 inches to about 4 inches in width.

The thickness of tape before application to a substrate should be about 0.003 inches to 0.015 inches (including the release layer). Preferably, the tape is less than, 0.010 inches thick.

A tape according to the invention may be formed by several different processes. One such process is to form the tape as a laminate as follows:

A metal foil of tinned copper about 1.5 inches in width is coated on one side with an electrically conductive pressure sensitive acrylic adhesive. A release paper is then placed over the adhesive to prevent its premature adherence to a substrate. Two adhesive strips formed of a pressure sensitive non conductive acrylic adhesive are then coated along the opposite side of the foil. The strips, approximately 0.125 inches in width, are spaced apart so as to form at least one adhesive free area about 0.5 inches in width on the central portion of foil surface. Additionally, the strips are spaced or indented from the outer edges of the foil layer by about 0.125 inches. A mask layer formed of a MYLAR® film, about 1.25 inches in width is centered over the strips and adhered thereto.

The tape is mounted by cutting the tape to length, peeling the release layer from the conductive adhesive layer and adhering the tape to the substrate. The substrate, such as a computer cabinet, is then treated with a finishing coat, such as paint such that it covers the entire tape surface.

After allowing the paint to a dry and/or cure, the mask portion is stripped from the tape to expose the adhesive free area. An EMI shielding device, such as a conductive elastomeric or metal mesh gasket, is then attached to the adhesive free area and the substrate is then mated with another substrate, such as a cabinet door to complete the installation.

The present invention provides several advantages. It eliminates the chipping of the paint or finish coat along the edge of the metal foil which caused corrosion of the substrate and/or failure of the previous mask systems. It provides a consistently removable mask that is not dependent upon a high temperature to ensure its release. Lastly, it eliminates the need for plating of the substrate which is costly and time consuming and which poses a potential threat to the environment.

While the present invention has been described in reference to its preferred embodiments, other variations, modifications and equivalents would be obvious to one skilled in the art and it is intended in the specification and appended claims to include all such variations, modifications and equivalents therein.

What we claim:

1. A masking laminate comprising an adhesive layer, a metal foil layer adhered to an upper surface of the adhesive layer, a plurality of adhesive strips formed along a length of the metal foil layer on a side opposite to the adhesive layer, the adhesive strips running parallel to an outer edge of the metal foil, the adhesive strips being spaced apart from one another so as to form one or more adhesive free areas on a surface of the foil layer, at least one of the adhesive free areas being centrally located on the foil layer and at least one releasable mask layer adhered to an upper surface of the adhesive strips.

2. The laminate of claim 1 wherein the adhesive layer is a pressure sensitive adhesive; the metal foil layer is selected from the group consisting of conductive metal foils, conductive metal alloys and conductive plated metal foils.

3. The laminate of claim 1 wherein the adhesive layer is electrically conductive.

4. The laminate of claim 3 wherein the conductive metal foil is selected from the group consisting of silver, gold, platinum, palladium, copper, nickel, tin, zinc, aluminum, cobalt, iron, steel and stainless steel.

5. The laminate of claim 3 wherein the conductive metal alloy foil is selected from the group consisting of silver, gold, platinum, palladium, copper, nickel, tin, zinc, aluminum, cobalt, iron, steel and stainless steel alloys.

6. The laminate of claim 3 wherein the plated metal foils are selected from the group consisting of noble metal plated metal foils, and non noble metal plated metal foils.

7. The laminate of claim 1 wherein the metal foil layer has a series of projections which extend through the adhesive layer.

8. The laminate of claim 7 wherein the adhesive layer is electrically conductive.

9. The laminate of claim 1 wherein the adhesive layer is an electrically conductive pressure sensitive adhesive.

10. The laminate of claim 1 further comprising a release layer attached to an outer surface of the adhesive layer.

11. The laminate of claim 1 wherein the plurality of adhesive strips is two.

12. The laminate of claim 1 wherein the mask layer has a width equal to or less than the width of the foil layer.

13. The laminate of claim 1 wherein the mask layer has a width substantially equal to the width of the foil layer and the mask layer has a series of perforations formed parallel to the width of the foil but inward from the width of the foil.

14. The laminate of claim 1 wherein the width of the mask layer and the distance from an outer edge of the outermost adhesive strip to an outer edge of an opposite outer most adhesive strip are equal and the width of the mask and the distance between the outer most strips is less than the width of the metal foil layer.

15. A conductive tape comprising a metal foil layer having a length greater than its width, the foil layer having a bottom side and a top side, a conductive adhesive layer being formed on the bottom side, a plurality of adhesive strips formed on the top side of the foil layer and running parallel to the length of the foil layer, the adhesive strips being spaced apart from one another so as to form one or more adhesive free areas on the top side of the foil layer, and one or more releasable mask layers adhered to an upper surface of the adhesive strips.

16. The tape of claim 15 wherein the metal foil is selected from the group consisting of conductive metal foils, conductive metal alloys and plated conductive metal foils.

17. The tape of claim 15 wherein the metal foil is selected from the group consisting of copper, silver, gold, platinum, palladium, nickel, iron, iron alloys, tin, zinc, aluminum, steel, stainless steel, silver coated tin, silver coated copper, silver coated aluminum, silver coated zinc, nickel coated copper, nickel coated tin, nickel coated zinc, nickel coated iron and nickel coated iron alloy.

18. The tape of claim 15 wherein the conductive adhesive is a pressure sensitive conductive adhesive.

19. The tape of claim 15 further comprising a release layer bonded to an outer surface of the conductive adhesive layer.

20. The tape of claim 15 wherein the plurality of adhesive strips is two, a first strip running along a first edge of the top side of the foil and a second strip running along a second edge of the top side of the foil opposite and parallel to the first edge so as to form one adhesive free area in a center portion of the foil.

21. The tape of claim 15 wherein the releasable mask layer has a width substantially equal to the width of the foil layer and has a series of perforations arranged to be in juxtaposition with at least an inner edge of the plurality of adhesive strips.

22. The tape of claim 15 wherein the plurality adhesive strips are indented from the width of the foil layer so as to form a step or notch like configuration along the width of the foil.

23. The tape of claim 15 wherein the releasable mask has a width less than the width of the metal foil layer.

24. The tape of claim 15 wherein the width of the releasable mask layer corresponds to the distance between the outer edges of the outer most adhesive strips.

25. A conductive masking strip comprising an electrically conductive metal foil layer, a first side of the foil having a coating of a pressure sensitive electrically conductive adhesive, a second side of the foil, opposite the first side of the foil, has at least two thin adhesive strips running along a length of the foil layer, the strips being arranged so as to be spaced from either edge of the second surface and spaced apart from each other so as to form at least one centrally located adhesive free area on the foil layer, a removable mask layer having a width corresponding to the distance between the strips and being adhered to the two or more adhesive strips.

26. A masking laminate comprising an electrically conductive metal foil layer, the foil layer having a length substantially greater than its width, the foil layer having a series of projections extending outwardly from one surface, an adhesive layer coated onto the surface of the foil layer containing the projections, the adhesive layer having a thickness substantially equal to the height of the projections, at least two adhesive strips coated onto a surface of the foil layer opposite the surface containing the projections, the strips being spaced apart from each and running essential parallel to the width of the foil layer so as to form at least one adhesive free area on the foil surface, a removable mask layer having a width equal to or less than the width of the foil layer and being adhered to an upper surface of the two or more adhesive strips.

27. The masking laminate of claim 26 wherein the metal foil layer is selected from the group consisting of silver foil, gold foil, platinum foil, palladium foil, copper foil, aluminum foil, tin foil, zinc foil, cobalt foil, nickel foil, iron foil, stainless steel foil, silver plated copper foil, silver plated aluminum foil, silver plated nickel foil and tin plated copper foil, the adhesive layer is selected from the group consisting of non electrically conductive pressure sensitive adhesives and electrically conductive pressure sensitive adhesives and the mask layer is selected from the group consisting of polymeric films, coated paper, woven and non woven fabrics and metal foils.

28. The masking laminate of claim 26 wherein the number of adhesive strips is two, first strip running along a first outer edge of the foil layer and a second strip running along a second outer edge of the foil layer and the first and second adhesive strips being parallel to each other and the outer edges of the foil layer.

29. The masking laminate of claim 28 wherein the first and second adhesive strips are inward of the outer edges of the foil layer so as to form a stepped or notched configuration.

30. The masking laminate of claim 29 wherein the width of the mask layer is equal to the distance from an outer edge of the first adhesive strip to an outer edge of the second adhesive strip.

31. The masking laminate of claim 26 wherein the adhesive strips and the mask layer are removable from the metal foil layer.

32. The masking laminate of claim 26 wherein a portion of the mask layer having a width substantially equal to or greater than the width of the adhesive free area is removable.

33. A conductive strip comprising an electrically conductive metal foil layer, a first side of the foil having a first adhesive layer covering the first side and a means for providing electrical conductivity between the foil layer and a surface to which it is bonded, a second side of the foil layer, opposite the first side of the foil layer having a means for forming an adhesive free area centrally located on the second side of foil layer, a second adhesive layer covering the means for forming the adhesive free area and a portion of the second side of the foil beyond the centrally located adhesive free area, the second adhesive layer being arranged so as to be spaced inwardly from either edge of the second side of the foil layer, and a removable mask layer adhered to the second adhesive layer on the second side and having a width greater than the centrally located adhesive free area, but equal to or less than that of the second adhesive layer the second side of the foil layer.

34. The conductive strip of claim 33 wherein the means for providing electrically conductivity between the foil and the surface to which it is bonded is selected from the group consisting of a series of projections extending outwardly from the first side of the foil layer and being substantially the same height as the thickness of the first adhesive layer, a conductively filled adhesive or both; and wherein the means for forming an adhesive free centrally located area on the second surface is a plastic film.

35. A conductive masking strip comprising a metal foil layer having a first and second surfaces opposite each other, the first surface having a conductive adhesive layer coated on it so as to bond the foil to a substrate and provide conductivity between the foil and the substrate, the second surface having a centrally located, adhesive free area covered by a plastic film, an adhesive layer covering the plastic film and a portion of the second surface beyond the plastic film, but less than the entire width of the second surface, a mask layer adhered to the adhesive layer of the second surface and substantially covering the adhesive layer of the second surface.

* * * * *